(12) United States Patent
Ohtani et al.

(10) Patent No.: US 6,380,561 B1
(45) Date of Patent: Apr. 30, 2002

(54) SEMICONDUCTOR DEVICE AND PROCESS FOR PRODUCING THE SAME

(75) Inventors: Hisashi Ohtani; Etsuko Fujimoto, both of Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/289,982

(22) Filed: Apr. 13, 1999

(30) Foreign Application Priority Data

Apr. 27, 1998 (JP) .................................. 10-117430

(51) Int. Cl.$^7$ .................................. H01L 29/786
(52) U.S. Cl. .................. 257/72; 257/71; 349/42
(58) Field of Search .................. 257/71, 72; 349/42

(56) References Cited

U.S. PATENT DOCUMENTS

| | | |
|---|---|---|
| 4,759,610 A | 7/1988 | Yanagisawa |
| 4,948,231 A | 8/1990 | Aoki et al. |
| 4,984,033 A | 1/1991 | Ishizu et al. |
| 5,087,113 A * | 2/1992 | Sakono .................. 349/42 |
| 5,121,236 A | 6/1992 | Ukai et al. |
| 5,510,916 A * | 4/1996 | Takahashi .................. 349/42 |
| 5,672,888 A * | 9/1997 | Nakamura .................. 349/42 |
| 5,708,485 A * | 1/1998 | Sato .................. 349/42 |
| 5,942,310 A * | 8/1999 | Moon .................. 257/72 |

* cited by examiner

*Primary Examiner*—Jerome Jackson, Jr.
(74) *Attorney, Agent, or Firm*—Eric J. Robinson; Nixon Peabody LLP

(57) ABSTRACT

To provide a semiconductor device having a large aperture ratio, in which an auxiliary capacitance of a large capacity is provided in each pixel.

Capacitance wiring 102 comprising a tantalum film is formed on a substrate 101 having an insulating surface, and a tantalum oxide film 103 is formed by heat oxidation thereof. An active layer 104 comprising a semiconductor thin film is formed, and an auxiliary capacitance comprising the structure obtained by sandwiching the tantalum oxide film 103 with a part of the active layer 104 and the capacitance wiring 102 is formed. The active layer 104 functions as an active layer of a top-gate TFT.

43 Claims, 5 Drawing Sheets

ADDITION OF N-TYPE IMPURITY

SEMICONDUCTOR DEVICE AND PROCESS FOR PRODUCING THE SAME

BACKGROUND OF THE INVENTION

1. Field of the Invention

The present invention relates to a semiconductor device having a circuit comprising a thin film transistor (abbreviated as TFT hereinafter) formed by using a semiconductor thin film. In particular, it relates to a technique of a constitution of an auxiliary capacitance formed in each pixel of an active matrix type liquid crystal display device.

The semiconductor device used herein means any device that can function utilizing semiconductor characteristics, and involves an electro-optical device, such as the liquid crystal display device, and an electronic device carrying the display device.

2. Background Art

In recent years, an active matrix type liquid crystal display device comprising a circuit constituted with a thin film transistor (called TFT hereinafter) utilizing a polysilicon film has received attention. In the display device, an electric field applied on a liquid crystal is controlled in a matrix form by plural pixels arranged in a matrix form, so as to display an image of high precision.

In the active matrix type liquid crystal display device, a capacitance (condenser) is formed between a pixel electrode provided for each pixel and a counter electrode formed on the opposite side of the pixel electrode via a liquid crystal. Because the capacitance is not large enough for such a constitution, the capacitance is generally supplied by forming an auxiliary capacitance (sometimes called Cs).

For example, a structure has been known, in which capacitance wiring is formed on the same layer with the same material as the gate electrode, and an auxiliary capacitance is formed between the capacitance wiring and a part of an active layer (called a capacitance forming part) with a gate insulating film as a dielectric material.

In this structure, however, electric conductivity should be previously endowed to the capacitance forming part by adding an impurity before forming the capacitance wiring. That is, when a step of addition of an impurity is conducted after forming the capacitance wiring, the impurity is not added to the capacitance forming part, and thus it does not function as a capacitance electrode. Therefore, this structure cannot utilize advantages of the process, in which a source region and a drain region are formed in a self-aligning.

Another proposal has been made to solve such a problem in that a capacitance forming part, to which no impurity is added, is utilized as an electrode. That is, a constant voltage is always applied to the capacitance wiring, so that a channel region is always formed in the capacitance forming part, and the channel region is used as an electrode. However, this constitution is not preferred since it brings about an increase in the consumption of electric power of the liquid crystal display device.

Accordingly, in a liquid crystal display device utilizing a top-gate TFT produced by a self-matching process such as pixel TFT, a method of forming an auxiliary capacitance effectively utilizing the self-aligning process has not yet been developed.

SUMMARY OF THE INVENTION

An object of the invention is to provide an electro-optical device having a high aperture ratio, in which each pixel has a large auxiliary capacitance, and a process for producing the same. Another object of the invention is to provide an electronic device carrying the electro-optical device as a display.

The invention relates to, as a first aspect, a semiconductor device comprising a structure, in which each of plural pixels arranged in a matrix form has a top-gate TFT and an auxiliary capacitance.

The auxiliary capacitance has a structure, in which a tantalum oxide film is sandwiched with a tantalum film and a semiconductor thin film; the semiconductor thin film constitutes a part of an active layer of the top-gate TFT; and the tantalum film is formed below beneath the semiconductor thin film.

The invention also relates to, as a second aspect, a semiconductor device comprising a structure, in which each of plural pixels arranged in a matrix form has a top-gate TFT and an auxiliary capacitance.

The auxiliary capacitance has a structure, in which a laminated film comprising a tantalum oxide film and an insulating film containing silicon is sandwiched with a tantalum film and a semiconductor thin film; the semiconductor thin film constitutes a part of an active layer of the top-gate TFT; and the tantalum film is formed below the semiconductor thin film.

In the first and second aspect of the invention, the tantalum oxide film is formed by heat oxidation of the tantalum film. While the tantalum oxide film can be formed by an anodic oxidation method in addition to the heat oxidation method, the heat oxidation film and the anodic oxidation film are different in withstanding voltage from each other, and these can be easily distinguished by electric evaluation.

The invention further relates to, as a third aspect, a process for producing a semiconductor device, the process comprising a step of forming capacitance wiring comprising a tantalum film on a substrate having an insulating surface, a step of forming a tantalum oxide film on a surface of the capacitance wiring by a heat oxidation method, and a step of forming a semiconductor thin film to cover the tantalum oxide film, wherein the process comprises a step of producing a top-gate TFT using the semiconductor thin film as an active layer.

The invention further relates to, as a fourth aspect, a process for producing a semiconductor device, the process comprising a step of forming capacitance wiring comprising a tantalum film on a substrate having an insulating surface, a step of forming a tantalum oxide film on a surface of the capacitance wiring by a heat oxidation method, a step of forming a semiconductor thin film to cover the tantalum oxide film, a step of forming a gate insulating film and a gate electrode on the semiconductor thin film, and a step of forming a gate insulating film and a gate electrode on the semiconductor thin film, and a step of forming a source region and a drain region by adding an impurity element using the gate electrode as a mask.

In the third and fourth aspects of the invention, the heat oxidation method is generally conducted in a temperature range of from 450 to 600° C. One of the characteristic features of the invention resides in that the heat treatment for forming the tantalum oxide is conducted before the formation of an active layer/gate insulating film interface, which is sensitive to heat. Furthermore, because the heat treating step is conducted at a relatively low temperature of from 450 to 600° C., a problem such as warp of glass does not occur even when the device is formed on a glass substrate.

DETAILED DESCRIPTION OF THE INVENTION

Figure 1:
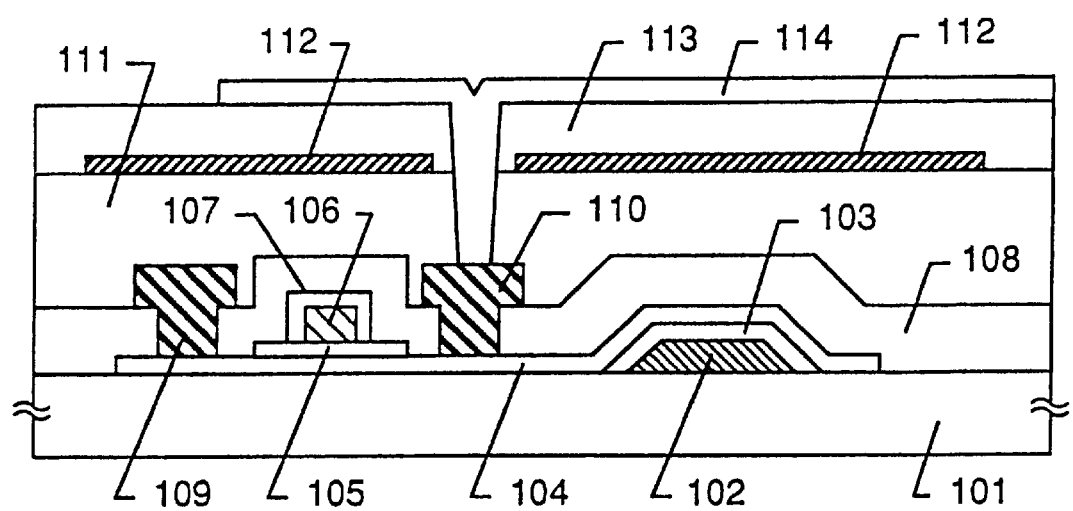
FIG. 1 is a cross sectional view showing the structure of the pixel according to the invention.

An embodiment of the invention will be described with reference to FIG. 1. FIG. 1 is a cross sectional view of an active matrix substrate (substrate, on which a TFT is formed) of a liquid crystal display device according to the invention.

In FIG. 1, numeral 101 denotes a substrate having an insulating surface, 102 denotes capacitance wiring comprising a tantalum film (functioning as a lower electrode of an auxiliary capacitance), 103 denotes a tantalum oxide film obtained by heat oxidation of the capacitance wiring 102. Numeral 104 denotes an active layer comprising a semiconductor thin film, which is an active layer of a TFT and simultaneously functions as an upper electrode of the auxiliary capacitance.

The tantalum oxide film 103 is sandwiched with the capacitance wiring 102 comprising the tantalum film and the active layer 104 comprising the semiconductor thin film, to form an auxiliary capacitance using the tantalum oxide film 103 as a dielectric material. The invention is characterized in that because the tantalum oxide film having a high dielectric constant is used as a dielectric material, an auxiliary capacitance of an extremely large capacity can be realized with a small area.

A gate insulating film 105 and a gate electrode 106 are formed on the active layer 104. In FIG. 1, the gate electrode 106 comprises an aluminum series material having a low resistance, and the surface thereof is protected with a non-porous anodic oxidation film 107 to prevent hillock. Other metallic films and silicon films, to which conductivity is endowed, can be used as the gate electrode.

A first interlayer insulating film 108 comprising an insulating film containing silicon is formed thereon, and source wiring 109 and drain wiring 110 are formed through contact holes. A second interlayer insulating film 111 comprising a resin material, a black mask 112 comprising a light shielding material and a third interlayer insulating film 113 comprising a resin material are formed on the wiring, and a pixel electrode 114 and the drain wiring 110 are electrically connected to each other via a contact hole.

As described in the foregoing, one of the characteristics features of the invention resides in the that the capacitance wiring 102 comprising the tantalum film and the active layer 104 comprising the semiconductor thin film are used as electrodes for forming the auxiliary capacitance, and the tantalum oxide film 103 is used as a dielectric material.

Because the tantalum oxide film 103 has a high dielectric constant, the area occupied by the capacitance wiring 102 in the pixel can be as small as possible. Therefore, the area required for forming the auxiliary capacitance can be reduced, and a pixel region having a high aperture ratio can be obtained.

Another important characteristic feature of the invention is that the tantalum oxide film 103 is formed by heat oxidation. The tantalum oxide film formed by heat oxidation exhibits good electric characteristics in the electric evaluation of J-E characteristics. The electric evaluation of J-E characteristics used herein means a method for evaluating an insulation property of an insulating film by a current density (J) and an electric field intensity While it is possible to form a tantalum oxide film by an anodic oxidation of a tantalum film, the anodic oxidized film is inferior in J-E characteristics to the heat oxidized film and is not suitable as a dielectric material of an auxiliary capacitance. Distinction between the tantalum oxide film formed by heat oxidation and that formed by anodic oxidation can be made based on the difference in J-E characteristics.

Because the processing temperature of the step of heat oxidation of the tantalum film is necessarily about from 400 to 550° C., the formation step of the tantalum oxide film is completed before the production of the active layer and the gate insulating film in the invention. This is because the interfacial characteristics between the active layer and the gate insulating film often changed by a heat treatment, and therefore the process that influences the interfacial characteristics should be completed before the formation of the interface.

The invention will be described in more detail with reference to the following examples.

EXAMPLE 1

In this example, a process for producing a liquid crystal display device utilizing the invention is described with reference to FIGS. 2A to 2E. In the active matrix substrate, a cross section of a unit pixel constituting a pixel matrix circuit is described for example in this example.

As a substrate 201 having an insulating surface, a glass substrate having an underlying film comprising a silicon oxide is prepared. A tantalum film having a thickness of 250 nm is formed and patterned, to form capacitance wiring 202 comprising the tantalum film. The thickness of the tantalum film is not limited to this.

A heating treatment at 450° C. for 1 hour (furnace annealing) is conducted to perform a heat oxidation step of the capacitance wiring 202. Through the heat oxidation 4 step, a tantalum oxide film having a film thickness of about 100 nm is formed on the surface of the capacitance wiring 202. The tantalum oxide film functions as a dielectric material of an auxiliary capacitance in the later stage.

The heat oxidation step of the capacitance wiring 202 can be conducted in a temperature range of from 450 to 600° C. The higher the temperature is, the larger the thickness of the tantalum oxide film formed in a unit period of time is, but when a glass substrate is used as the substrate, taking the warp of the glass into consideration, the temperature is preferably within the range of from 450 to 500° C.

One of the advantages of the use of the heat oxidation method in the invention is that the tantalum oxide film is formed only around the capacitance wiring (specifically on the upper surface and the side surface). The reason of this advantage will be described below.

The sputtering method or the CVD method is generally used for the film formation of a tantalum oxide film. However, when these film forming methods are employed, a tantalum oxide film is formed on the whole surface of the substrate, and an active layer comprising a silicon film is necessarily formed on the tantalum oxide film.

It has been known that when a high temperature is applied to a tantalum oxide film and a silicon film that are in contact with each other, a mutual reaction occurs between tantalum oxide and silicon. Therefore, it is preferred that tantalum oxide film is not formed under the active layer (particularly the channel forming region).

From the standpoint described above, because a tantalum oxide film is formed only around (on the upper surface and the side surface) the capacitance wiring by employing the thermal oxidation method in this example, the tantalum oxide film is prevented from being formed under the channel forming region. While the tantalum oxide film and the silicon film are in contact with each other around the capacitance wiring 202, such contact does not bring about any problem since it does not influence the TFT characteristics.

After forming the capacitance wiring 202 and the tantalum oxide film 203 around the capacitance wiring, an amorphous silicon film (not shown in the figures) having a thickness of 50 nm is formed, and crystallization is conducted by using the technique described in Japanese laid-open application 7-130652. A crystalline silicon film (not shown in the figures) obtained by the crystallization is patterned to form an active layer 204 comprising the crystalline silicon film in the island form.

The crystallization step of the amorphous silicon film can be conducted according to any of the conventional means. The technique described in Japanese laid-open application 7-130652 by the inventors is preferred since the crystallization can be completed at a low temperature in a short period of time by the function of a catalyst element (typically nickel).

In the case where the crystallization step of the amorphous silicon film is conducted by furnace annealing, there is a possibility in that the heat oxidation reaction of the capacitance wiring proceeds unless the treating atmosphere is an inert atmosphere and the treatment is completed in a short period of time. From the standpoint described above, the technique described in the publication is preferably employed.

A laser crystallization step using excimer laser annealing can also be employed. Furthermore, a silicon germanium film represented by $Si_xGe_{1-x}$ (0<x<1) can be employed instead of the amorphous silicon film.

Figure 2A:
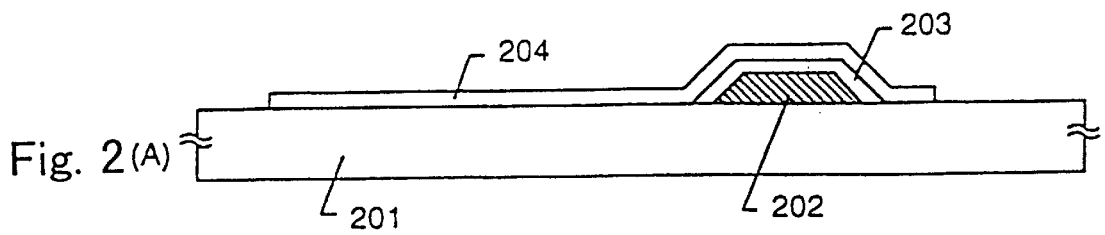
FIGS. 2A to 2E are cross sectional views showing the production process of the structure of the pixel according to the invention.
Figure 2B:
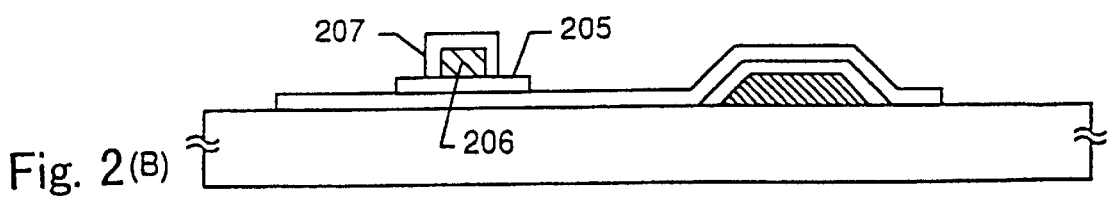

After forming the active layer 204 comprising the crystalline silicon film, the state shown in FIG. 2A is obtained. After obtaining this state, the state shown in FIG. 2B is obtained by using the technique described in Japanese laid-open application 7-135318. The detail of the technique can be seen in the examples of this publication.

In the state shown in FIG. 2B, numeral 205 denotes a gate insulating film comprising a silicon oxide film, 206 denotes a gate electrode comprising an aluminum series material, 207 denotes an anodic oxidation film obtained by anodic oxidation of the gate electrode 206.

The aluminum series material used herein means a material comprising aluminum or aluminum added with an impurity. The anodic oxidized film 207 is a dense non-porous alumina film, which is produced in an electrolytic solution comprising an ethylene glycol solution of tartaric acid having a concentration of 3% by weight neutralized by mixing an aqueous ammonia having a concentration of 5% by weight.

Figure 2C:
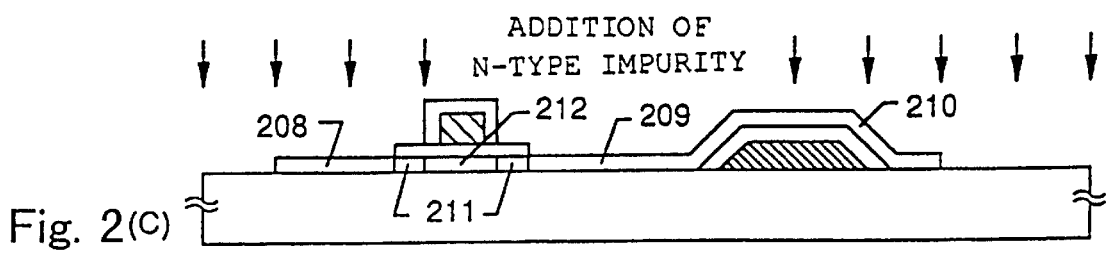

After obtaining the state shown in FIG. 2B, an impurity endowing n-type semiconductivity (abbreviated as n-type impurity) is added by the ion doping method. As the addition step of the impurity, the technique described in Japanese laid-open application 7-135318 shown above can be utilized. (FIG. 2C)

While an embodiment in which a pixel matrix circuit is formed with an N-channel TFT is exemplified in this example, in the case where the pixel matrix circuit is formed with a P-channel TFT, an impurity endowing p-type semiconductivity (abbreviated as p-type impurity) can be added. Representative examples of the n-type impurity include phosphorous (P), arsenic (As) and antimony (Sb). Examples of the p-type impurity include boron (B) and gallium (Ga).

By conducting the addition of the impurities by utilizing the technique described in Japanese laid-open application 7-135318, a source region 208 and a drain region 209 of the TFT are formed. A part of drain region 209 that overlaps the capacitance wiring 202 (denoted by 210) has a conductivity by the addition of the impurity, and functions as an upper electrode of an auxiliary capacitance.

One of the advantages of the invention resides in that a conductivity can be imparted to a part of the active layer used as an electrode of an auxiliary capacitance, at the same time as the formation of the source region and the drain region. Because the addition step of the impurity can be conducted in a completely self-aligning, the yield can be increased without influenced by the precision of patterning. A low concentration impurity region (sometimes called an LDD region) 211 is formed inside the source region 208 and the drain region 209, and a channel forming region 212 is formed further inside them.

A first interlayer insulating film 213 comprising a silicon oxide film is formed to a thickness of 1 μm, and after making contact holes, a source electrode 214 and a drain electrode 215 are formed. Other insulating films may be used as the interlayer insulating film 213. The source electrode 214 and the drain electrode 215 may be formed with a conductive film such as a metallic film. (FIG. 2D)

Figure 2D:
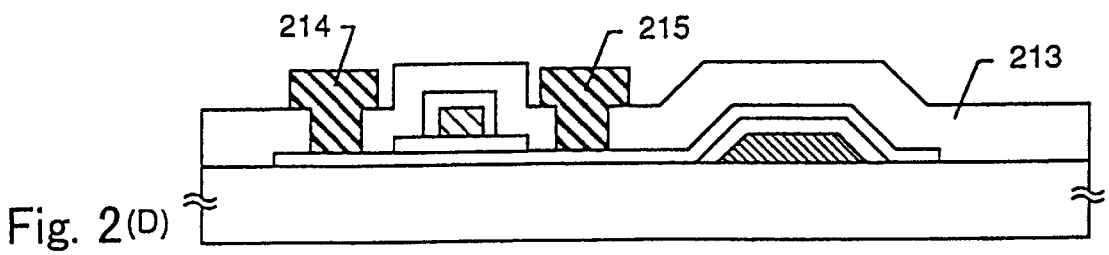

After obtaining the state shown in FIG. 2D, a second interlayer insulating film 216 comprising an organic resin film having a light transmission property is formed to a thickness of 1 μm. In this example, an acrylic material is used as the organic resin film.

A black mask 217 comprising a light shielding material is formed thereon. While a titanium film having a thickness of 100 nm is used as the black mask 217 in this example, a resin material colored black or other metallic films may be employed.

After forming the black mask 217, a third interlayer insulating film 218 is formed with a resin material having a light transmission property (an acrylic resin in this example) to a thickness of 1 μm. After forming a contact hole, a pixel electrode 219 is formed. While an ITO film is used as the pixel electrode 219 in this example, other transparent conductive films may be used.

In the case where a transparent conductive film is used as the pixel electrode in the structure of this example, a transmission type liquid crystal display device can be produced. In the case where a material having a high reflection such as an aluminum series material is used as the pixel electrode, a reflection type liquid crystal display device can be produced.

Since a titanium film is used as the black mask 217 in this example, an auxiliary capacitance can be formed between the black mask 217 and the pixel electrode 219 with the third interlayer insulating film 218 used as a dielectric material. In the case where such a structure is employed, because this auxiliary capacitance is in the conditions in that it is connected to the auxiliary capacitance using the capacitance wiring in parallel, an auxiliary capacitance of a further larger capacity in total can be ensured.

Figure 2E:
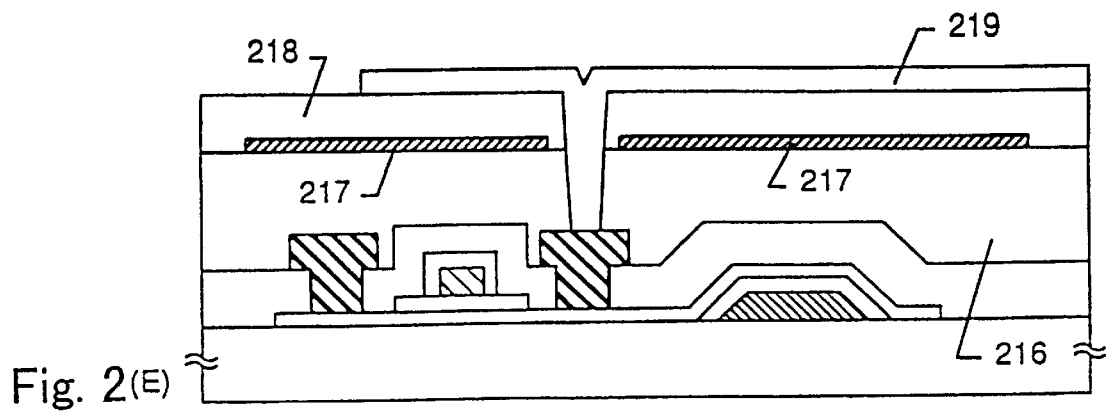

Throughout the production process described above, an active matrix substrate having the structure shown in FIG. 2E is completed. Thereafter, an oriented film is formed to cover the pixel electrode, a counter substrate comprising a counter electrode and an oriented film is prepared, and a liquid crystal material is filled between the counter substrate and the active matrix substrate. As the cell fabrication step, a practician can appropriately select from the conventional technique, thus the explanation thereof is omitted here.

Figure 3:
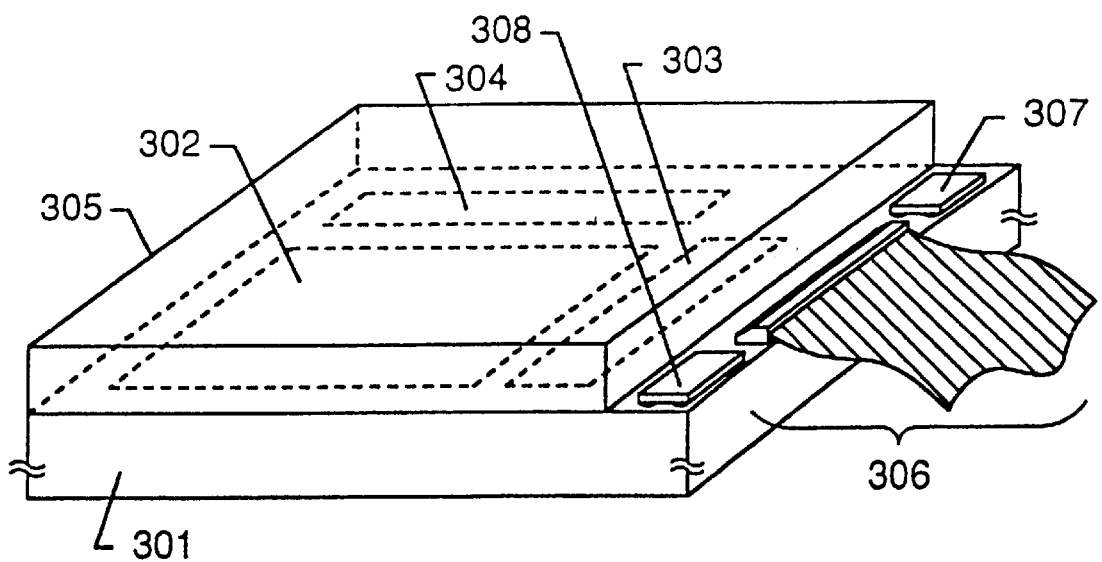
FIG. 3 is a perspective view showing an appearance of the liquid crystal display device according to the invention.

The active matrix type liquid crystal display device having the structure shown in FIG. 3 is completed. In FIG. 3, numeral 301 denotes a substrate having an insulating surface, 302 denotes a pixel matrix circuit, 303 denotes a source driver circuit, 304 denotes a gate driver circuit, 305 denotes a counter electrode, 306 denotes an FPC (flexible printed circuit), and 307 and 308 denote IC chips externally mounted.

The IC chips 307 and 308 may be attached depending on necessity, and in some cases, a circuit having the function equivalent to the IC chip may be united with the source driver circuit or the gate driver circuit. That is, a signal processing circuit, such as a D/A converter circuit and a gamma-compensation circuit, may be constituted with a TFT.

While the liquid crystal display device is exemplified in this example, the invention can be applied to an EL (electrolumiescenece) display device and an EC (electrocromics) display device, as far as they are an active matrix type display device.

EXAMPLE 2

In this example, an embodiment is exemplified, in which an insulating film containing silicon is formed to cover the tantalum oxide film 203 before the formation of the amorphous silicon film in the process of Example 1.

Figure 4:
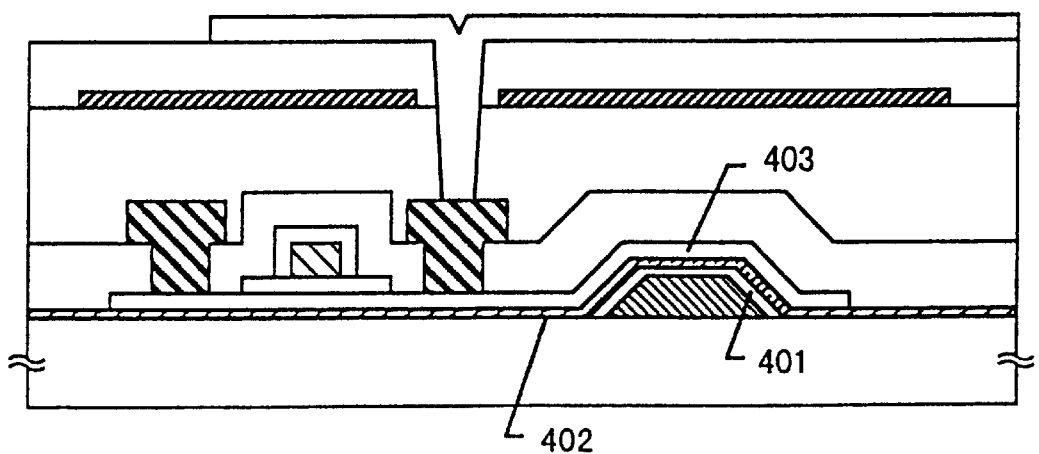
FIG. 4 is a cross sectional view showing the structure of the pixel according to the invention.

The structure shown in FIG. 4 is substantially the same as the structure shown in FIG. 1, but they are different from each other in that an insulating film 402 is formed to cover a tantalum oxide film 401 in FIG. 4.

There is a problem in that when a high temperature is applied to a tantalum oxide film and a silicon film in contact with each other, a mutual reaction occurs between tantalum oxide and silicon, as described in the foregoing. In the structure shown in Example 1, it has been noted that the tantalum oxide film and the silicon film are in contact with each other only around the capacitance wiring, and the TFT characteristics are not influenced.

However, even though the problem does not become severe in the part of the auxiliary capacitance, it is not preferred since the production process cannot be conducted stably when the mutual reaction once occurs. Therefore, means for preventing such a mutual reaction as possible are demanded.

In this example, the insulating film 402 containing silicon is formed between the tantalum oxide film 401 and the active layer 403, so as to prevent the mutual reaction between tantalum oxide and silicon. As the insulating film 402 containing silicon, a silicon oxide film, a silicon nitride film or a silicon oxide nitride film (represented by $SiO_xN_y$) can be employed. A silicon nitride film suffers a large stress and largely influences the active layer, and therefore it can be said that a silicon oxide film and a silicon oxide nitride film are preferred.

In the case where the constitution of this example is employed, an insulating film such as a silicon oxide film is formed before the formation of the amorphous silicon film in the production process of Example 1. The thickness of the insulating film 402 containing silicon is sufficient to be 50 nm or more, to prevent the mutual reaction. When it is too thick, the thickness of the dielectric material of the auxiliary capacitance to decrease the capacity, and it is considered that the upper limit of the thickness is 100 nm.

By employing the structure of this example, a production process of higher reliability is realized by completely preventing the mutual reaction between the tantalum oxide film and the silicon film, and an auxiliary capacitance without dispersion due to the process can be formed.

EXAMPLE 3

The electro-optical devices shown in Examples 1 and 2 are utilized as a display device of various kinds of electronic device. Examples of the electronic device include a camcorder, a still camera, a projection display, a projection television, a head-mounting display, a car navigation system, a personal computer, and a portable information terminal (such as a portable computer and a cellular phone). Examples thereof are shown in FIGS. 5A to 5F.

Figure 5A:
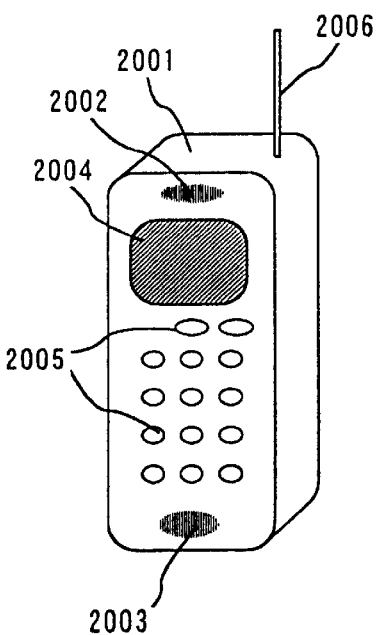
FIGS. 5A to 5F are schematic perspective views showing electronic devices.

FIG. 5A shows a cellular phone, which comprises a main body 2001, a voice input part 2002, a voice output part 2003, a display device 2004, operation switches 2005 and an antenna 2006. The invention can be applied to the display device 2004, for example.

Figure 5B:
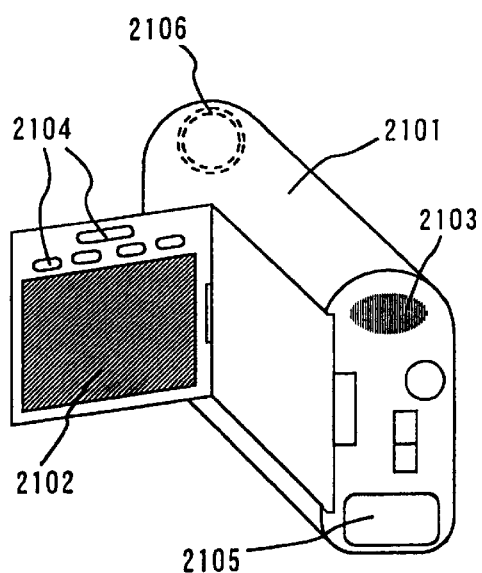

FIG. 5B shows a camcorder, which comprises a main body 2101, a display device 2102, a voice input part 2103, operation switches 2104, a battery 2105 and an image receiving part 2106. The invention can be applied to the display device 2102.

Figure 5C:
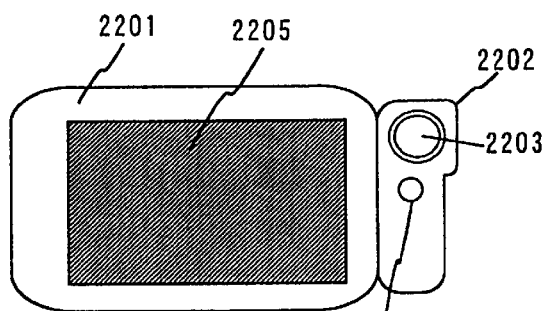

FIG. 5C shows a portable computer, which comprises a main body 2201, a camera part 2202, an image receiving part 2203, an operation switch 2204 and a display device 2205. The invention can be applied to the display device 2205, for example.

Figure 5D:
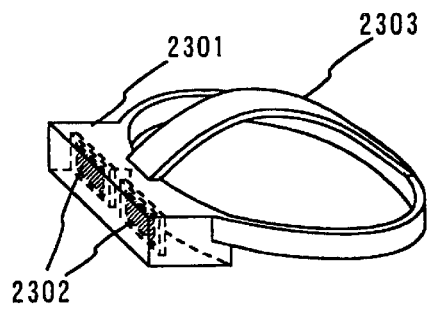

FIG. 5D shows a head-mounting display, which comprises a main body 2301, a display device 2302 and a band part 2303. The invention can be applied to the display device 2302.

Figure 5E:
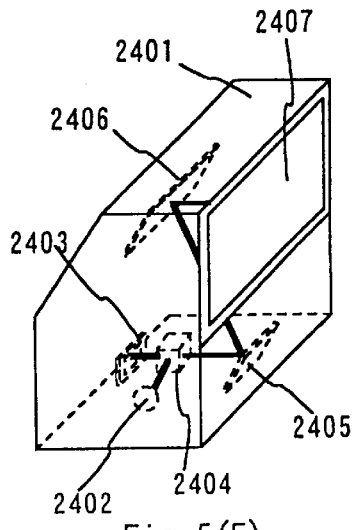

FIG. 5E shows a transmission type projection display, which comprises a main body 2401, a light source 2402, a display device 2403, a polarizing beam splitter 2404, reflectors 2405 and 2406 and a screen 2407. The invention can be applied to the display device 2403.

Figure 5F:
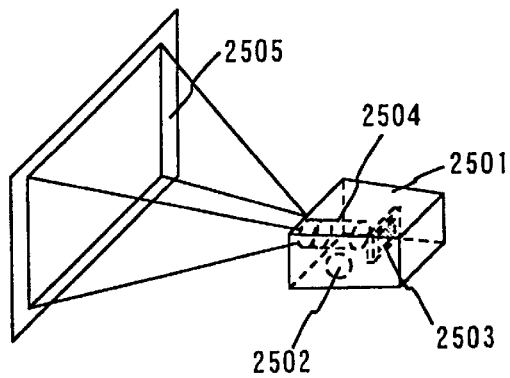

FIG. 5F shows a reflection type projection display, which comprises a main body 2501, a light source 2502, a display device 2503, an optical system 2504 and a screen 2505. The invention can be applied to the display device 2503.

As described foregoing, the application range of the invention is extremely wide, and the invention can be applied to any electronic device of any field.

EXAMPLE 4

Figure 6:
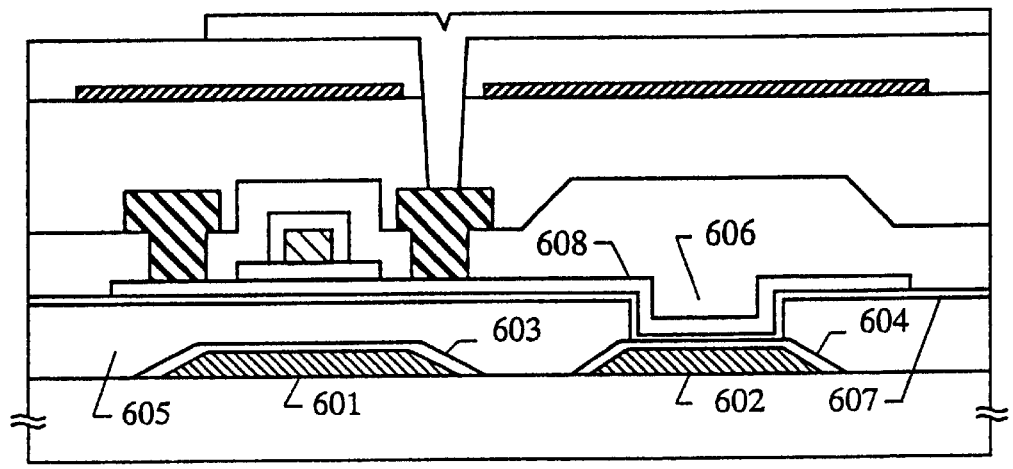
FIG. 6 is a cross sectional view showing the structure of the pixel according to the invention.

In this example, an embodiment is described, in which a light shielding film is formed beneath the TFT as another embodiment of Example 2, with reference to FIG. 6. The structure shown in FIG. 6 is substantially the same as the structure of FIG. 1, and only the necessary parts are described with attaching symbols.

In FIG. 6, numeral 601 denotes a light shielding film, which is formed with a tantalum film simultaneously with capacitance wiring 602. Tantalum oxide films 603 and 604 are formed on the surfaces thereof. An underlying film 605 comprising an insulating film containing silicon having a thickness of from 200 to 500 nm (preferably from 250 to 300 nm) is formed thereon.

In the underlying film 605, an opening 606 is formed on the capacitance wiring 602, to once expose the tantalum oxide film 604. A thin insulating film 607 containing silicon having a thickness of from 10 to 30 nm and an active layer 608 are laminated in this order. The active layer 608 comprises a crystalline silicon film obtained by crystallizing an amorphous silicon film continuously formed on the insulating film containing silicon without exposing to the air.

In this state, at least the tantalum oxide film 603, the underlying film 605 and the insulating film 607 containing silicon are present between the TFT and the light shielding film 601, and the thickness is as large as 200 nm or more. This is because the formation of a parasitic capacitance between the TFT and the light shielding film 601 is prevented as possible.

However, in the part of storage capacitance, the capacity of the storage capacitance becomes small due to adverse influence of the thickness of the underlying film 605. Accordingly, in this example, an opening 606 is formed in the underlying film above the capacitance wiring 602, and the dielectric material of the storage capacitance is constituted only with the tantalum oxide film 604 and the thin insulating film 607 containing silicon. The insulating film 607 containing silicon is provided to prevent the mutual reaction between the active layer 608 and the tantalum oxide film 604.

By employing the constitution, the insulating layer present between the light shielding film 601 and the active layer 608 has a thickness larger by 5 to 10 times than the thickness of the insulating layer present between the capacitance wiring 602 and the active layer 608. As a result, even in the structure in which the light shielding film is provided beneath the TFT, a parasitic capacitance is substantially not formed between the TFT and the light shielding film, and a pixel structure of a sufficiently large storage capacitance can be realized.

By practicing the invention, in a liquid crystal display device using a top-gate TFT as a pixel TFT, an auxiliary capacitance using a tantalum oxide film as a dielectric material can be produced in each pixel through the simple production process.

Since the dielectric constant of the tantalum oxide film is as high as about 11.6, the area of the auxiliary capacitance can be small. Accordingly, the area of the auxiliary capacitance occupying in the pixel becomes small, and the aperture ratio of the transmission liquid crystal display device can be improved.

According to the invention, an electro-optical device of a large aperture ratio, in which an auxiliary capacitance of a large capacity is provided in each pixel, can be realized, and an electronic device carrying such an electro-optical device as a display can be realized.

What is claimed is:

1. A semiconductor device comprising a structure, in which each of plural pixels arranged in a matrix form has a top-gate TFT and an auxiliary capacitance, wherein
said auxiliary capacitance has a structure, in which a tantalum oxide film is sandwiched with a tantalum film and a semiconductor film; said semiconductor film constitutes a part of an active layer of said top-gate TFT; and said tantalum film is formed below said semiconductor film.

2. A semiconductor device comprising a structure, in which each of plural pixels arranged in a matrix form has a top-gate TFT and an auxiliary capacitance, wherein
said auxiliary capacitance has a structure, in which a laminated film comprising a tantalum oxide film and an insulating film containing silicon is sandwiched with a tantalum film and a semiconductor film;
said semiconductor film constitutes a part of an active layer of said top-gate TFT; and said tantalum film is formed below said semiconductor film.

3. A semiconductor device as claimed in claim 1 wherein said tantalum oxide film is a heat oxidation film of said tantalum film.

4. A semiconductor device as claimed in claim 2 wherein said tantalum oxide film is a heat oxidation film of said tantalum film.

5. A semiconductor device as claimed in claim 1 wherein said tantalum oxide film is formed only around said tantalum film.

6. A semiconductor device as claimed in claim 2 wherein said tantalum oxide film is formed only around said tantalum film.

7. A semiconductor device as claimed in claim 1 wherein said top-gate TFT comprises a gate electrode comprising an aluminum series material.

8. A semiconductor device as claimed in claim 2 wherein said top-gate TFT comprises a gate electrode comprising an aluminum series material.

9. A semiconductor device according to claim 1 wherein said semiconductor device is a display device selected from the group consisting of a liquid crystal display device, an electroluminescence display device and an electrochlomic display device.

10. A semiconductor device according to claim 2 wherein said semiconductor device is a display device selected from the group consisting of a liquid crystal display device, an electroluminescence display device and an electrochlomic display device.

11. A semiconductor device having at least an active matrix panel comprising a plurality of pixels, each said pixel comprising:
a thin film transistor on an insulating surface, said thin film transistor having at least source and drain regions and a channel forming region therebetween formed within a semiconductor film, and a gate electrode formed over said channel forming region; and
an auxiliary capacitance having a metal oxide film comprising tantalum sandwiched between a metal film comprising tantalum and said semiconductor film,
wherein said metal film is formed below said semiconductor film.

12. A semiconductor device according to any one of claims 1, 2 and 11 further comprises a main body, a voice input part, a display device, operation switches and an antenna to constitute a cellular phone.

13. A semiconductor device according to any one of claims 1, 2 and 11 further comprises a main body, a display device, a voice input part, operation switches, a battery, and an image receiving part to constitute a camcorder.

14. A semiconductor device according to any one of claims 1, 2 and 11 further comprises a main body, operation switches and a display device to constitute a portable computer.

15. A semiconductor device according to any one of claims 1, 2 and 11 further comprises a main body, a display device and a band part to constitute a head-mounting display.

16. A semiconductor device according to any one of claims 1, 2 and 11 further comprises a main body, a light source, a display device, a polarizing beam splitter, reflectors and a screen to constitute a transmission type projection display.

17. A semiconductor device according to any one of claims 1, 2 and 11 further comprises a main body, a light source, a display device, an optical device and a screen to constitute a reflection type projection display.

18. A semiconductor device according to claim 11 wherein said semiconductor device is a display device selected from the group consisting of a liquid crystal display device, an electroluminescence display device and an electrochlomic display device.

19. A semiconductor device having at least an active matrix panel comprising a plurality of pixels, each said pixel comprising:
   a thin film transistor on an insulating surface, said thin film transistor having at least source and drain regions and a channel forming region therebetween formed within a semiconductor film, and a gate electrode formed over said channel forming region; and
   an auxiliary capacitance having a laminated film comprising a metal oxide film containing tantalum and an insulating film containing silicon,
   wherein said laminated film is sandwiched between a metal film comprising tantalum and said semiconductor film,
   wherein said metal film is formed below said semiconductor film.

20. A semiconductor device according to claim 19 wherein said semiconductor device is a display device selected from the group consisting of a liquid crystal display device, an electroluminescence display device and an electrochlomic display device.

21. A semiconductor device according to claim 19 further comprises a main body, a voice input part, a display device, operation switches and an antenna to constitute a cellular phone.

22. A semiconductor device according to claim 19 further comprises a main body, a display device, a voice input part, operation switches, a battery, and an image receiving part to constitute a camcorder.

23. A semiconductor device according to claim 19 further comprises a main body, operation switches and a display device to constitute a portable computer.

24. A semiconductor device according to claim 19 further comprises a main body, a display device and a band part to constitute a head-mounting display.

25. A semiconductor device according to claim 19 further comprises a main body, a light source, a display device, a polarizing beam splitter, reflectors and a screen to constitute a transmission type projection display.

26. A semiconductor device according to claim 19 further comprises a main body, a light source, a display device, an optical device and a screen to constitute a reflection type projection display.

27. A semiconductor device having at least an active matrix panel comprising a plurality of pixels, each said pixel comprising:
   a thin film transistor on an insulating surface, said thin film transistor having at least source and drain regions and a channel forming region therebetween formed within a semiconductor film, and a gate electrode formed over said channel forming region; and
   an auxiliary capacitance having a metal oxide film sandwiched between a metal film and said semiconductor film,
   wherein said metal film is formed below said semiconductor film.

28. A semiconductor device according to claim 27 further comprises a main body, a voice input part, a display device, operation switches and an antenna to constitute a cellular phone.

29. A semiconductor device according to claim 27 further comprises a main body, a display device, a voice input part, operation switches, a battery, and an image receiving part to constitute a camcorder.

30. A semiconductor device according to claim 27 further comprises a main body, operation switches and a display device to constitute a portable computer.

31. A semiconductor device according to claim 27 further comprises a main body, a display device and a band part to constitute a head-mounting display.

32. A semiconductor device according to claim 27 further comprises a main body, a light source, a display device, a polarizing beam splitter, reflectors and a screen to constitute a transmission type projection display.

33. A semiconductor device according to claim 27 further comprises a main body, a light source, a display device, an optical device and a screen to constitute a reflection type projection display.

34. A semiconductor device having at least an active matrix panel comprising a plurality of pixels, each said pixel comprising:
   a thin film transistor on an insulating surface, said thin film transistor having at least source and drain regions and a channel forming region therebetween formed within a semiconductor film, and a gate electrode formed over said channel forming region; and
   an auxiliary capacitance having a laminated film comprising a metal oxide film and an insulating film containing silicon,
   wherein said laminated film is sandwiched between a metal film and said semiconductor film,
   wherein said metal film is formed below said semiconductor film.

35. A semiconductor device according to claim 34 wherein said gate electrode is formed over said channel forming region.

36. A semiconductor device according to claim 34 further comprises a main body, a voice input part, a display device, operation switches and an antenna to constitute a cellular phone.

37. A semiconductor device according to claim 34 further comprises a main body, a display device, a voice input part, operation switches, a battery, and an image receiving part to constitute a camcorder.

38. A semiconductor device according to claim 34 further comprises a main body, operation switches and a display device to constitute a portable computer.

39. A semiconductor device according to claim 34 further comprises a main body, a display device and a band part to constitute a head-mounting display.

40. A semiconductor device according to claim 34 further comprises a main body, a light source, a display device, a polarizing beam splitter, reflectors and a screen to constitute a transmission type projection display.

41. A semiconductor device according to claim 34 further comprises a main body, a light source, a display device, an optical device and a screen to constitute a reflection type projection display.

42. A semiconductor device according to claim 27 wherein said semiconductor device is a display device selected from the group consisting of a liquid crystal display device, an electroluminescence display device and an electrochlomic display device.

43. A semiconductor device according to claim 34 wherein said semiconductor device is a display device selected from the group consisting of a liquid crystal display device, an electroluminescence display device and an electrochlomic display device.

* * * * *